(12) United States Patent
Tran et al.

(10) Patent No.: US 9,437,574 B2
(45) Date of Patent: Sep. 6, 2016

(54) ELECTRONIC COMPONENT PACKAGE AND METHOD FOR FORMING SAME

(71) Applicants: Tu-Anh N. Tran, Austin, TX (US); Chu-Chung Lee, Round Rock, TX (US)

(72) Inventors: Tu-Anh N. Tran, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 32 days.

(21) Appl. No.: 14/042,662

(22) Filed: Sep. 30, 2013

(65) Prior Publication Data

US 2015/0090480 A1 Apr. 2, 2015

(51) Int. Cl.
*H05K 1/11* (2006.01)
*H05K 1/09* (2006.01)
*H01L 23/00* (2006.01)

(52) U.S. Cl.
CPC ............... *H01L 24/85* (2013.01); *H01L 24/03* (2013.01); *H01L 24/05* (2013.01); *H01L 24/48* (2013.01); *H01L 24/45* (2013.01); *H01L 24/78* (2013.01); *H01L 2224/04042* (2013.01); *H01L 2224/05085* (2013.01); *H01L 2224/05558* (2013.01); *H01L 2224/05624* (2013.01); *H01L 2224/45147* (2013.01); *H01L 2224/45565* (2013.01); *H01L 2224/45572* (2013.01); *H01L 2224/45644* (2013.01); *H01L 2224/45664* (2013.01); *H01L 2224/48453* (2013.01); *H01L 2224/48463* (2013.01); *H01L 2224/48507* (2013.01); *H01L 2224/48824* (2013.01); *H01L 2224/78301* (2013.01); *H01L 2224/8581* (2013.01); *H01L 2224/85181* (2013.01); *H01L 2224/85207* (2013.01); *Y10T 29/49124* (2015.01)

(58) Field of Classification Search
USPC .......................................................... 361/767
See application file for complete search history.

(56) References Cited

U.S. PATENT DOCUMENTS

| 5,235,212 | A | | 8/1993 | Shimizu et al. | |
|---|---|---|---|---|---|
| 5,407,862 | A | * | 4/1995 | Miyamoto | H01L 21/28 257/E21.158 |
| 5,834,365 | A | * | 11/1998 | Ming-Tsung | H01L 24/03 257/E23.02 |

(Continued)

FOREIGN PATENT DOCUMENTS

| EP | 2339622 A1 | 6/2011 |
|---|---|---|
| JP | 2012109419 A | 6/2012 |

OTHER PUBLICATIONS

Restriction Requirement mailed Apr. 24, 2015 for U.S. Appl. No. 14/147,234, 7 pages.

(Continued)

*Primary Examiner* — Timothy Thompson
*Assistant Examiner* — Michael F McAllister

(57) ABSTRACT

An electronic component package includes a substrate and dielectric structure. The dielectric structure includes a top surface having a protrusion portion and a lower portion. The protrusion portion is located at first height that is greater than a second height of the lower portion. A conductive bond pad is located over the dielectric structure. A ball bond electrically couples the bond pad and a bond wire. An intermetallic compound located between the ball bond and bond pad is formed of material of the ball bond and bond pad and electrically couples the bond pad to the ball bond. A portion of the bond pad is vertically located between a portion of the lower portion of the top surface of the dielectric structure and the intermetallic compound. No portion of the bond pad is vertically located between at least a portion of the protrusion portion and the intermetallic compound.

18 Claims, 4 Drawing Sheets

(56) References Cited

U.S. PATENT DOCUMENTS

| | | | |
|---|---|---|---|
| 5,942,800 A | 8/1999 | Yiu et al. | |
| 6,110,816 A | 8/2000 | Huang et al. | |
| 6,306,750 B1 | 10/2001 | Huang et al. | |
| 6,387,734 B1 | 5/2002 | Inaba et al. | |
| 6,596,628 B2 | 7/2003 | Magara | |
| 7,169,694 B2 | 1/2007 | Pozder et al. | |
| 7,535,078 B2* | 5/2009 | Kobayashi | H01L 23/5256 257/529 |
| 7,646,097 B2 | 1/2010 | Yu et al. | |
| 7,888,259 B2 | 2/2011 | Zbrzezny et al. | |
| 7,969,021 B2* | 6/2011 | Uno | B21C 37/042 174/126.1 |
| 8,552,560 B2 | 10/2013 | Bhatt et al. | |
| 8,846,520 B2 | 9/2014 | Matsuda | |
| 2002/0089062 A1 | 7/2002 | Saran et al. | |
| 2004/0135223 A1* | 7/2004 | Allman | H01L 24/05 257/459 |
| 2005/0206007 A1* | 9/2005 | Li | H01L 21/7684 257/762 |
| 2005/0215048 A1* | 9/2005 | Li | H01L 24/03 438/622 |
| 2007/0102182 A1 | 5/2007 | Okada et al. | |
| 2007/0102812 A1 | 5/2007 | Sun et al. | |
| 2007/0114667 A1 | 5/2007 | Bhatt et al. | |
| 2007/0134903 A1 | 6/2007 | Ryan | |
| 2008/0111244 A1* | 5/2008 | Tessmer | H01L 24/05 257/765 |
| 2008/0179745 A1* | 7/2008 | Hess | H01L 24/05 257/751 |
| 2012/0001336 A1* | 1/2012 | Zeng | H01L 24/05 257/769 |
| 2013/0001777 A1 | 1/2013 | Veychard et al. | |

OTHER PUBLICATIONS

Non-Final Office Action mailed Jul. 17, 2015 for U.S. Appl. No. 14/147,238, 13 pages.

Nguyen, L.T. et al., "Optimization of Copper Wire Bonding on Al—Cu Metallization," IEEE Transactions on Components, Packaging, and Manufacturing Technology—Part A, vol. 18, No. 2, (1995), pp. 423-429.

Schueller, R., "Copper Wire Bond Failure Mechanisms," DfR Soluations, 2012, 8 pages.

Wei, T.C. et al., "Cratering on Thermosonic Copper Wire Ball Bonding," Journal of Materials Engineering and Performance, vol. 11, Issue 3, Jun. 2002; pp. 283-287.

1 Non-Final Office Action mailed Aug. 12, 2015 for U.S. Appl. No. 14/147,234, 13 pages.

Final Office Action mailed Nov. 4, 2015 for U.S. Appl. No. 14/147,238, 16 pages.

U.S. Appl. No. 14/147,238, Office Action—Notice of Allowance, mailed Feb. 11, 2016.

U.S. Appl. No. 14/147,234, Office Action—Final Rejection, mailed Feb. 8, 2016.

U.S. Appl. No. 14/147,238, Office Action—Non-Final Rejection, mailed Jun. 16, 2016, 19 pages.

\* cited by examiner

ELECTRONIC COMPONENT PACKAGE AND METHOD FOR FORMING SAME

BACKGROUND

1. Field

This disclosure relates generally to electronic component packages, and more specifically, to electronic component packages with an intermetallic layer between a wirebond and protrusions in a passivation layer.

2. Related Art

Electronic component packages can include one or more electronic components such as semiconductor processors. Electrically conductive contact with the electronic components can be established with wire bonds formed on bond pads that are connected to circuitry in the electronic components. The assembly of the electronic components with wire bonds is then encapsulated in a protective covering to seal the electronic components from contaminants and protect the wire bonds from breakage.

As the price of gold rises, it becomes more economical to use less costly conductive materials such as copper, aluminum and silver to replace the use of gold in electronic component packages. For example, gold can be replaced with copper and copper alloys for wire bonds while aluminum can be used as bond pads. As the use of copper wire on aluminum pad becomes more common, various performance issues with these materials arise.

In some cases, in order to meet customer requirements and qualify for shipment, electronic component packages are subject to various tests to simulate performance of the packages over time in expected operating environments. One such test involves subjecting the electronic component packages to temperature extremes such as between −50 to 150 degrees Celsius for a specified duration (for example, 30 minutes per cycle) and a specified number of cycles (for example, 2000 cycles). As the size of the electronic components is continually decreasing and the number of the electronic components in a package is ever-increasing, reliability issues can arise that previously were not an issue with larger wire sizes, larger ball bond sizes and fewer components. For example, as wire size and ball bond size for the wire bonds get smaller, the temperature cycling can cause cracks between the aluminum bond pad and an intermetallic compound at the interface between the copper wire bond and the aluminum bond pad. The cracks can be severe enough to destroy the connection to the circuitry coupled to the bond pad.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of electronic component packages and methods for fabricating the packages are disclosed that include protrusions in a layer of dielectric or passivation material between a wire bond and a bond pad. The protrusions help prevent cracks at the interface between the aluminum bond pad and the intermetallic compound (IMC) from forming and propagating across the wire bond. The protrusions in the dielectric or passivation layer extend through the aluminum bond pad to the IMC and can be located at points of highest stress concentration on the wire bonds, thereby substantially eliminating aluminum between the protrusion and the IMC. The protrusions can be continuous, or segmented in a manner that eliminates a continuous path for cracks to propagate along the IMC under the wire bond.

Figure 1:
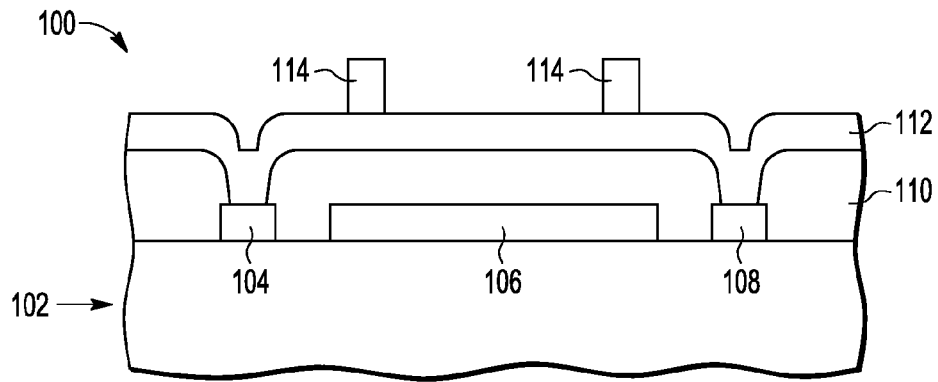
FIG. 1 is a cross-sectional view of an embodiment of an electronic component package during an intermediate stage of manufacture.

FIG. 1 is a cross-sectional view of an embodiment of a portion of an electronic component package 100 during an intermediate stage of manufacture. Package 100 includes substrate 102, last metal layer traces 104, 106, 108, first dielectric or passivation layer 110, second dielectric or passivation layer 112, and photoresist mask 114. Substrate 102 can be any semiconductor material or combination of materials, such as gallium arsenide, silicon germanium, silicon-on-insulator (SOI), silicon, monocrystalline silicon, the like, and combinations of the above. Electronic circuitry (not shown) can be formed on substrate 102 and one or more layers of electrically conductive interconnections alternating with dielectric layers (not shown) can be formed above the circuitry. Last metal layer traces 104-108 are coupled to respective portions of the circuitry via the interconnect layers. Traces 104-108 can be made of aluminum, copper, and/or other electrically conductive materials, as well as alloys of aluminum, copper, and/or other conductive materials. Dielectric layers 110, 112 are conformally deposited and formed of nitride, silicon oxide, silicon oxynitride, and/or other suitable dielectric material that contains glass. A layer of photoresist material is deposited over the dielectric layer 110, 112 and patterned to form photoresist mask 114 over a selected portion of dielectric layer 112. Dielectric layers 110, 112 can each have a thickness ranging from 2000 to 12,000 Angstroms, or other suitable thickness. Dielectric layers 110, 112 can have the same or a different thickness.

Figure 2:
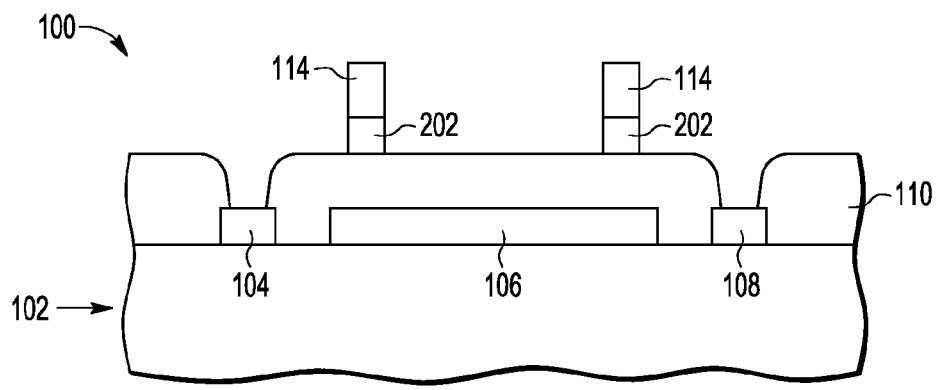
FIG. 2 is a cross-sectional view of the electronic component package of FIG. 1 during a subsequent stage of manufacture.

FIG. 2 is a cross-sectional view of the electronic component package 100 of FIG. 1 during a subsequent stage of manufacture after unmasked portions of passivation layer 112 are etched to form protrusions 202 of passivation material over passivation layer 110. Protrusions 202 can have a height ranging from 2000 to 5000 Angstroms, or other suitable height. The combination of dielectric layer 110 and protrusions 202 can be referred to as a dielectric structure herein, with dielectric layer 110 being a lower portion and protrusions or protrusion portions 202.

Figure 3:
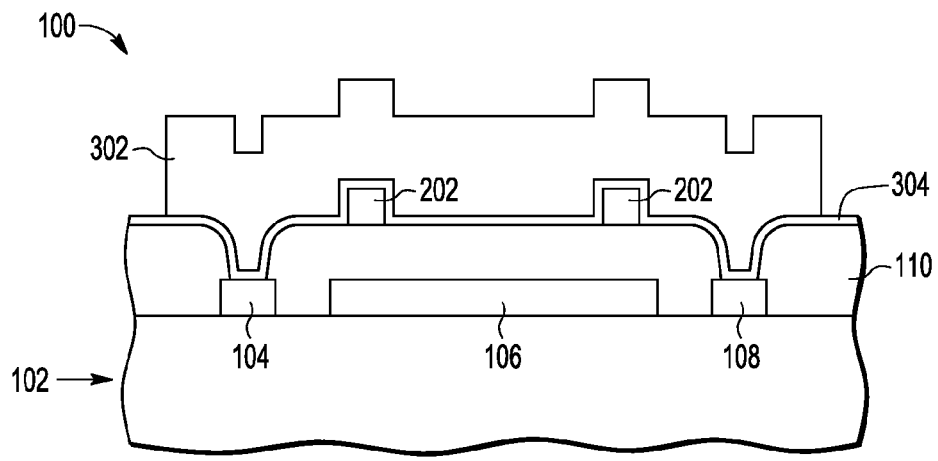
FIG. 3 is a cross-sectional view of the electronic component package of FIG. 2 during a subsequent stage of manufacture.

FIG. 3 is a cross-sectional view of the electronic component package 100 of FIG. 2 during a subsequent stage of manufacture after photoresist mask 114 has been removed, and barrier metal layer 304 and bond pad 302 have been conformally deposited in direct contact with traces 104 and 108, passivation layer 110 and protrusions 202. Barrier metal layer 304 can range from 200 to 1000 Angstroms thick and be formed of tantalum, tantalum nitride, titanium nitride or other suitable material. Bond pad 302 can range from 600 to 30,000 Angstroms thick and formed of aluminum, copper, and/or other suitable materials, or combinations thereof.

Figure 4:
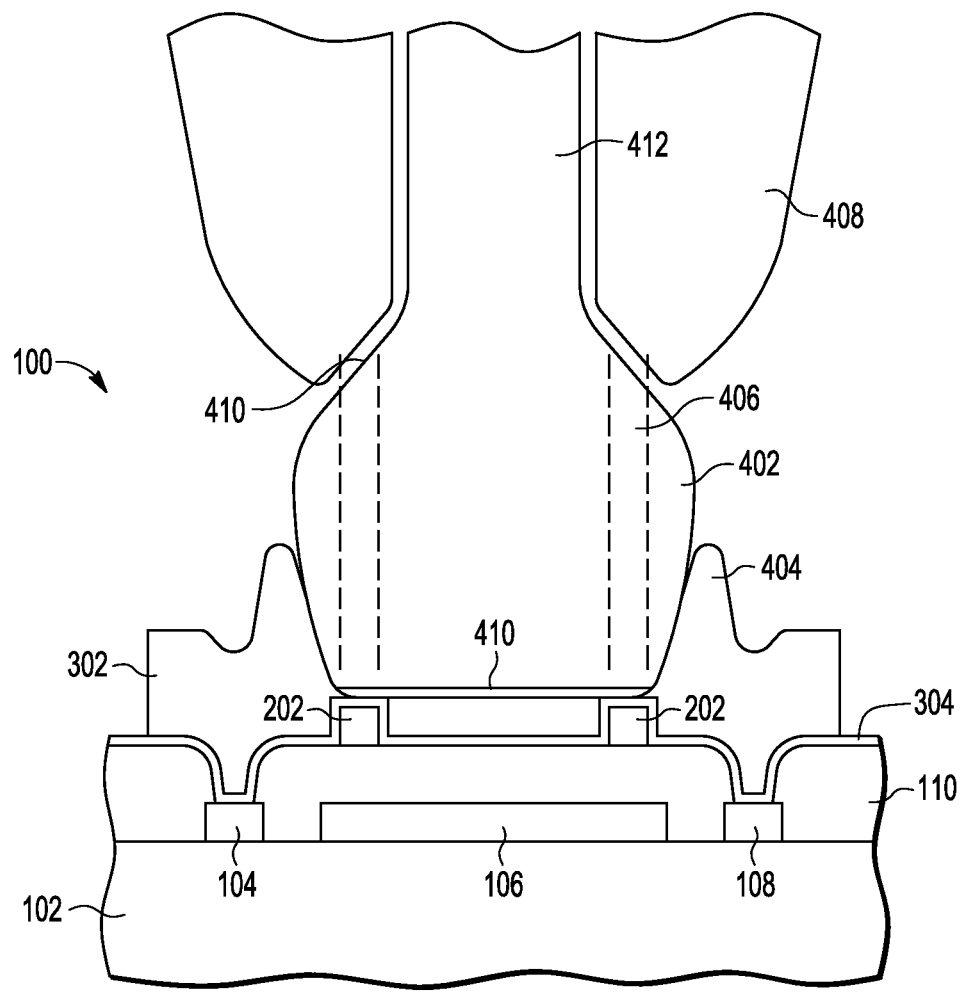
FIG. 4 is a cross-sectional view of the electronic component package of FIG. 3 during a subsequent stage of manufacture.

FIG. 4 is a cross-sectional view of the electronic component package 100 of FIG. 3 during a subsequent stage of manufacture as ball bond 402 is formed on bond pad 302. The force and elevated temperature required to form ball bond 402 causes a portion of the material 404 of bond pad 302 to be displaced from under bond pad 302 to around the periphery of ball bond 402. A thermosonic bonding process can be used that forms a layer of intermetallic compound (IMC) 410 under ball bond 402. IMC 410 is a mixture of material from ball bond 402 and bond pad 302. IMC 410 is also in contact with barrier metal layer 304 over protrusions 202. The material of bond pad 302 underlies and surrounds portions of IMC 410 that are not in contact with protrusions 202. A very thin layer (for example, with a thickness ranging from 0.05 to 0.2 micrometers) or portion of the material from bond pad 302 may remain between barrier metal layer 304 over protrusions 202 and IMC 410, but at least some of the IMC 410 will be in contact with at least some of barrier metal layer 304 over protrusions 202. The thickness of IMC 410 can range from 0.03 to 0.5 microns, or other suitable thickness.

The location of protrusions 202 can be chosen to be the location where the highest stress (indicated by dashed lines 406) is applied to chamfered portions 410 of ball bond 402 by capillary tool 408. The chamfered portion 410 of ball bond 402 is typically on the upper surface of the ball bond 402 between undeformed wire 412 at the top of the ball bond 402 and the widest part of the ball bond 402. Capillary tool 408 includes an opening threaded with material such as bond wire 412 used to form ball bond 402. The opening of capillary tool 408 from which bond wire 412 is dispensed has sloped inner sidewalls that gradually expand the opening to a largest diameter at the mouth of the opening. Thermosonic bonding includes using capillary tool 408 to apply heat, ultrasonic energy, and pressure to the mating surfaces, melting the bond wire 412 and forming a ball of wire 412 at bond pad 302 while bonding the wire to the surface of bond pad 302. Material for bond wire 412 can include copper as well as copper mixed with other suitable materials such as beryllium, calcium, palladium, silver, iron, nickel, magnesium, and/or sulfur. In some embodiments, bond wire 412 includes an outer covering of palladium, palladium gold, and/or dielectric insulation.

Figure 5:
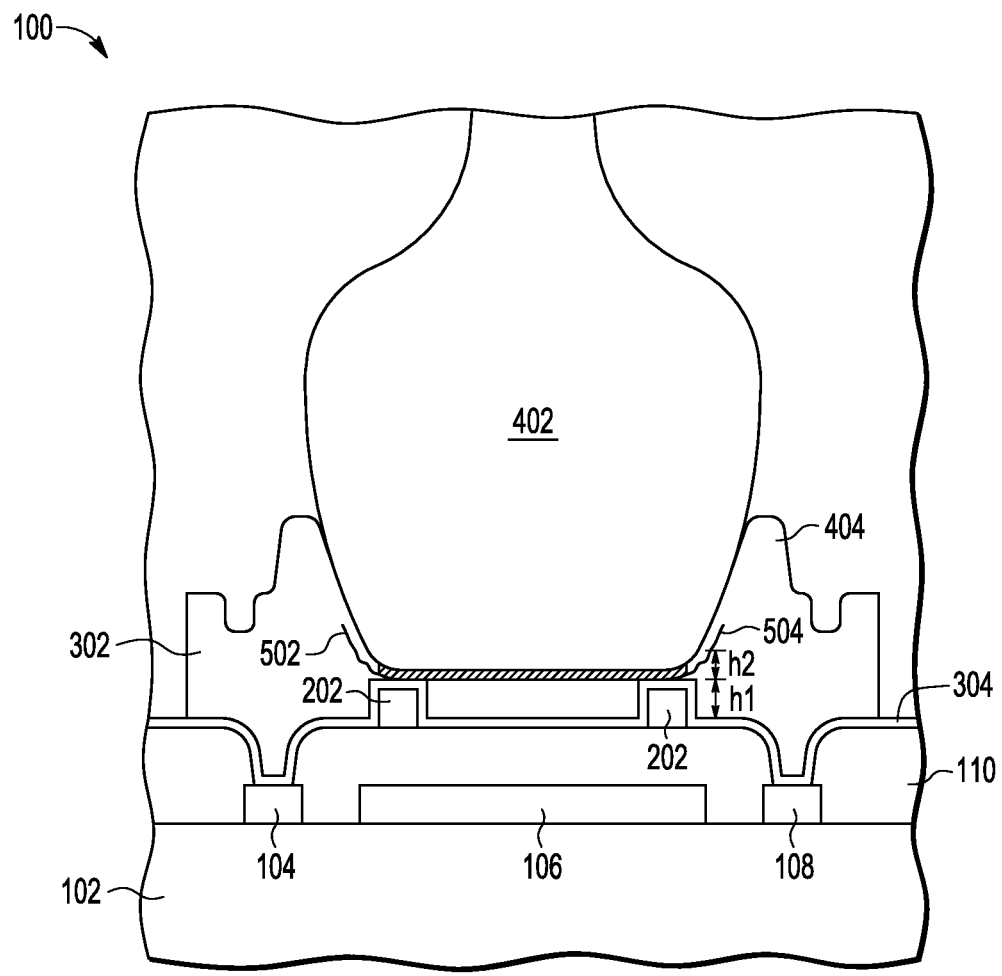
FIG. 5 is a cross-sectional view of the electronic component package of FIG. 4 during a subsequent stage of manufacture.

FIG. 5 is a cross-sectional view of the electronic component package 100 of FIG. 4 during a subsequent stage of manufacture after ball bond 402 has been formed and cracks 502, 504 have developed in the interface between bond pad 302 and ball bond 402. Cracks 502, 504 may extend to protrusions 202, however, the bond between IMC 410 and barrier metal 304 over protrusions 202 prevents cracks 502, 504 from propagating any further under ball bond 402, thereby preserving the reliability of the connection between traces 104 and 108 and bond pad 302.

Figure 6:
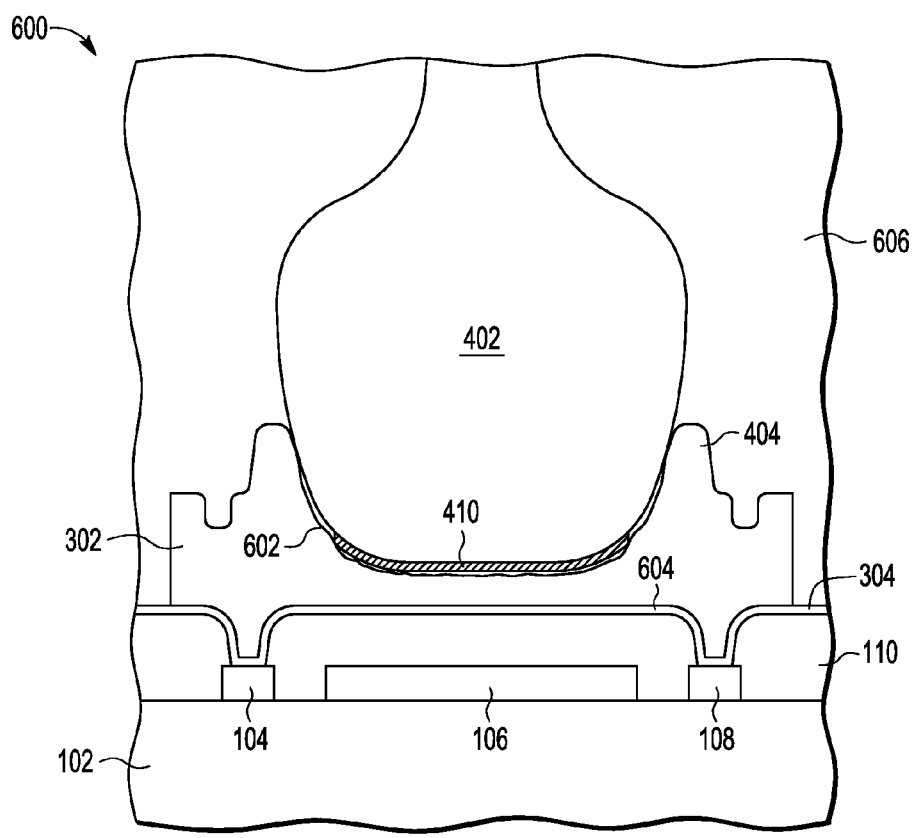
FIG. 6 is a cross-sectional view of an electronic component package showing a crack separating a wire bond from underlying aluminum bond pad.

FIG. 6 is a cross-sectional view of a previous electronic component package 600 that does not include protrusions 202 (FIGS. 2-5) or an IMC 410 bonded to at least some of barrier metal 304. Crack 602 has formed between IMC 410 and bond pad 302, resulting in ball bond 402 separating from underlying aluminum bond pad 302. The crack in the connection between ball bond 402 and bond pad 302 may be especially likely to form after package 600 has been subjected to a number of temperature cycles, whether during test or in field operation. Protrusions 202 (as shown in FIGS. 2-5) could be included to help prevent crack 602 from propagating under ball bond 402 to the extent that the connection between bond pad 302 and ball bond 402 is broken.

Figure 7:
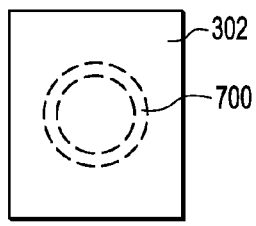
FIGS. 7-11 are top views of alternate embodiments of dielectric structures that can be used in an electronic component package, such as shown in FIGS. 1-5.

FIG. 7 is a top view of an embodiment of a protrusion portion 700 under bond pad 302 that forms protrusions 202 in the cross-section views of electronic component package 100 shown in FIGS. 1-5. Protrusion portion 700 is shown in dashed lines to indicate protrusion portion 700 is under bond pad 302 when viewed from the top of bond pad 302, however protrusion portion 700 has a continuous ring structure that fits within the perimeter of bond pad 302. In the embodiment shown, protrusion portion 700 is circular and covers less than approximately 5 to 20 percent of the area of bond pad 302. In some embodiments, protrusion portion 700 is located directly under the ball bond 402, and can further be located under chamfered portions 406 of ball bond 402 (FIG. 4).

Figure 8:
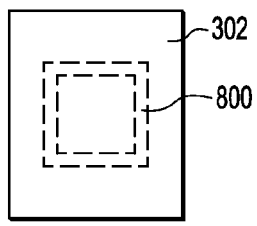

FIG. 8 is a top view of an embodiment of a protrusion portion 800 under bond pad 302 that forms protrusions 202 in the cross-section views of electronic component package 100 shown in FIGS. 1-5. Protrusion portion 800 is shown in dashed lines to indicate protrusion portion 800 is under bond pad 302 when viewed from the top of bond pad 302, however protrusion portion 800 has a continuous ring structure that fits within the perimeter of bond pad 302. In the embodiment shown, protrusion portion 800 is a polygon with four or less sides such as a triangle, square or rectangle and covers less than approximately 5 to 20 percent of the area of bond pad 302. In some embodiments, protrusion portion 800 is located directly under the ball bond 402, and can further be located under chamfered portions 406 of ball bond 402 (FIG. 4).

Figure 9:
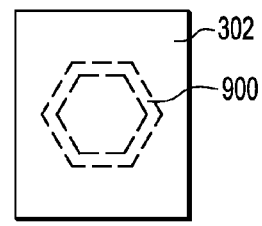

FIG. 9 is a top view of an embodiment of a protrusion portion 900 under bond pad 302 that forms protrusions 202 in the cross-section views of electronic component package 100 shown in FIGS. 1-5. Protrusion portion 900 is shown in dashed lines to indicate protrusion portion 900 is under bond pad 302 when viewed from the top of bond pad 302, however protrusion portion 900 has a continuous ring structure that fits within the perimeter of bond pad 302. In the embodiment shown, protrusion portion 900 is a polygon with more than 4 sides such as a pentagon, hexagon, heptagon, octagon, or nonagon and covers less than approximately 5 to 20 percent of the area of bond pad 302. In some embodiments, protrusion portion 900 is located directly under the ball bond 402, and can further be located under chamfered portions 406 of ball bond 402 (FIG. 4).

Figure 10:
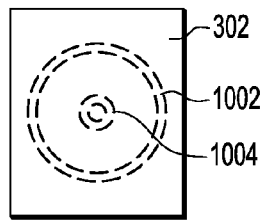

FIG. 10 is a top view of an embodiment of protrusion portions 1002, 1004 under bond pad 302 that form two sets of protrusions 202 in a cross-section view. Protrusion portions 1002, 1004 are shown in dashed lines to indicate protrusion portions 1002, 1004 is under bond pad 302 when viewed from the top of bond pad 302, however protrusion portions 1002, 1004 each have a continuous ring structure that fits within the perimeter of bond pad 302. In the embodiment shown, protrusion portions 1002, 1004 are circular with protrusion portion 1004 having a smaller diameter than protrusion 1002, and fitting within the diameter of protrusion portion 1002. Protrusion portions 1002, 1004 cover less than approximately 5 to 20 percent of the area of bond pad 302. In some embodiments, protrusion portions 1002, 1004 are located directly under the ball bond 402, and can further be located under chamfered portions 406 of ball bond 402 (FIG. 4).

Figure 11:
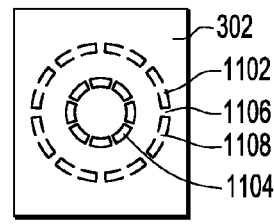

FIG. 11 is a top view of an embodiment of protrusion portions 1102, 1104 under bond pad 302 that form two sets of protrusions 202 in a cross-section view. Protrusion portions 1102, 1104 are shown in dashed lines to indicate protrusion portions 1102, 1104 is under bond pad 302 when viewed from the top of bond pad 302, however protrusion portions 1102, 1104 each have a staggered segmented ring structure that fits within the perimeter of bond pad 302. Protrusion portions 1102, 1104 include two or more semicircular segments that cover less than approximately 5 to 20 percent of the area of bond pad 302. The segments of protrusion portion 1104 are directly aligned with openings 1106 between segments 1108 in protrusion portion 1102 so that any cracks that extend through an opening 1106 in protrusion portion 1102 will be prevented from extending past a corresponding segment of protrusion portion 1104 aligned with opening 1106. In some embodiments, protrusion portions 1102, 1104 are located directly under the ball bond 402, and can further be located under chamfered portions 406 of ball bond 402 (FIG. 4).

By now it should be appreciated that there has been provided an electronic component package comprising a substrate; a dielectric structure, the dielectric structure including a top surface, the top surface including a protrusion portion and a lower portion, the protrusion portion being located at first height with respect to the substrate that is greater than a second height of the lower portion with respect to the substrate. A conductive bond pad is located over the dielectric structure. A ball bond electrically couples the bond pad and a bond wire. An intermetallic compound is located between the ball bond and the bond pad and formed of material of the ball bond and the bond pad, the intermetallic compound electrically couples the bond pad to the ball bond, where a portion of the bond pad is vertically located with respect to the substrate between a portion of the lower portion of the top surface of the dielectric structure and the intermetallic compound. For at least a portion of the protrusion portion, no portion of the bond pad is vertically located between the at least a portion of the protrusion portion and the intermetallic compound.

In another aspect, the bond pad can be characterized as an aluminum bond pad.

In another aspect, the bond wire can be characterized as a copper bond wire.

In another aspect, the copper bond wire has an outer covering of one of a group consisting palladium, palladium gold, and dielectric insulation.

In another aspect, all of the protrusion portion can be located directly under the ball bond.

In another aspect, the protrusion portion can include a ring structure surrounding a portion of the lower portion.

In another aspect, the ring structure can be characterized as a continuous ring structure.

In another aspect, the protrusion portion includes a first ring structure and a second ring structure, the first ring structure surrounds the second ring structure.

In another aspect, a distance between the first height and the second height can be in a range of 2000-5000 Angstroms.

In another aspect, the intermetallic compound can have a thickness in the range of 0.03-0.5 microns.

In another aspect, a percentage of an area of the bond pad occupied by the protrusion portion can be in a range of 5-20%.

In another embodiment, a method of forming an electronic component package can comprise providing an electronic component, the electronic component including a substrate and a dielectric structure located over the substrate, the dielectric structure including a top surface, the top surface including a protrusion portion and a lower portion, the protrusion portion being located at a first height with respect to the substrate that can be greater than a second height of the lower portion with respect to the substrate. The electronic component can further include a conductive bond pad located over the dielectric structure. A wire is bonded to the bond pad forming intermetallic compound located between the bond pad and a ball bond electrically coupled to the bond wire. The intermetallic compound electrically couples the bond pad to the ball bond. A portion of the bond pad can be vertically located with respect to the substrate between a portion of the lower portion of the top surface of the dielectric structure and the intermetallic compound. For at least a portion of the protrusion portion, no portion of the bond pad can be vertically located between the at least a portion of the protrusion portion and the intermetallic compound.

In another aspect, the bonding can be performed with a capillary tube, wherein the capillary tube has a chamfer with an inner chamfer perimeter and a hole with a hole perimeter. The protrusion portion includes a ring structure having an inner perimeter and an outer perimeter. A first diameter defined by a midpoint between the outer perimeter and the inner perimeter of the ring structure can be generally equal to a second diameter defined by a midpoint between the inner chamfer perimeter and the hole perimeter.

In another aspect, the bond pad can be characterized as an aluminum bond pad.

In another aspect, the bond wire can be characterized as a copper bond wire.

In another aspect, all of the protrusion portion can be located directly under the ball bond.

In another aspect, the protrusion portion includes a ring structure surrounding a portion of the lower portion.

In another aspect, the ring structure can be characterized as a continuous ring structure.

In another aspect, a distance between the first height and the second height can be in a range of 2000-5000 Angstroms.

In another aspect, the dielectric structure includes a first layer and a second layer formed over a first layer. The second layer can be patterned to form the protrusion portion, the lower portion can be defined by a top surface of the first layer over which the second layer have been removed.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electronic component package comprising:
a substrate;
a dielectric structure, the dielectric structure including a top surface, the top surface including a protrusion portion and a lower portion, the protrusion portion being located at first height with respect to the substrate that is greater than a second height of the lower portion with respect to the substrate;
a conductive bond pad located over the dielectric structure;
a bond wire;
a ball bond electrically coupling the bond pad and the bond wire;
an intermetallic compound located between the ball bond and the bond pad and formed of material of the ball bond and the bond pad, the intermetallic compound electrically coupling the bond pad to the ball bond, where a portion of the bond pad is vertically located with respect to the substrate between a portion of the lower portion of the top surface of the dielectric structure and the intermetallic compound, wherein for at least a portion of the protrusion portion, no portion of the bond pad is vertically located between the at least a portion of the protrusion portion and the intermetallic compound and the protrusion portion is located directly under the ball bond.

2. The electronic component package of claim 1 wherein the bond pad is characterized as an aluminum bond pad.

3. The electronic component package of claim 2 wherein the bond wire is characterized as a copper bond wire.

4. The electronic component package of claim 3 wherein the copper bond wire has an outer covering of one of a group consisting palladium, palladium gold, and dielectric insulation.

5. The electronic component package of claim 1 wherein the protrusion portion includes a ring structure surrounding a portion of the lower portion.

6. The electronic component of claim 5 wherein the ring structure is characterized as a continuous ring structure.

7. The electronic component package of claim 1 wherein the protrusion portion includes a first ring structure and a second ring structure, the first ring structure surrounding the second ring structure.

8. The electronic component package of claim 1 wherein a distance between the first height and the second height is in a range of 2000-5000 Angstroms.

9. The electronic component package of claim 1 wherein the intermetallic compound has a thickness in the range of 0.03-0.5 microns.

10. The electronic component package of claim 1 wherein a percentage of an area of the bond pad occupied by the protrusion portion is in a range of 5-20%.

11. An electronic component package, comprising:
an electronic component, the electronic component including a substrate and a dielectric structure located over the substrate, the dielectric structure including a top surface, the top surface including a protrusion portion and a lower portion, the protrusion portion being located at a first height with respect to the substrate that is greater than a second height of the lower portion with respect to the substrate, the electronic component further including a conductive bond pad located over the dielectric structure;
a wire bonded to the bond pad wherein the bonding forms of intermetallic compound located between the bond pad and a ball bond electrically coupled to the bond wire, the intermetallic compound electrically coupling the bond pad to the ball bond, wherein a portion of the bond pad is vertically located with respect to the substrate between a portion of the lower portion of the top surface of the dielectric structure and the intermetallic compound, wherein for at least a portion of the protrusion portion, no portion of the bond pad is vertically located between the at least a portion of the protrusion portion and the intermetallic compound, and the protrusion portion is located directly under the ball bond.

12. The electronic component package of claim 11 wherein the bonding is performed with a capillary tube, wherein the capillary tube has a chamfer with an inner chamfer perimeter and a hole with a hole perimeter, wherein the protrusion portion includes a ring structure having an inner perimeter and an outer perimeter, wherein a first diameter defined by a midpoint between the outer perimeter and the inner perimeter of the ring structure is generally equal to a second diameter defined by a midpoint between the inner chamfer perimeter and the hole perimeter.

13. The electronic component package of claim 11 wherein the bond pad is characterized as an aluminum bond pad.

14. The electronic component package of claim 13 wherein the bond wire is characterized as a copper bond wire.

15. The electronic component package of claim 11 wherein the protrusion portion includes a ring structure surrounding a portion of the lower portion.

16. The electronic component package of claim 15 wherein the ring structure is characterized as a continuous ring structure.

17. The electronic component package of claim 11 wherein a distance between the first height and the second height is in a range of 2000-5000 Angstroms.

18. The electronic component package of claim 11 wherein the dielectric structure includes a first layer and a second layer formed over a first layer, wherein the second layer is patterned to form the protrusion portion, the lower portion is defined by a top surface of the first layer over which the second layer have been removed.

* * * * *